United States Patent
Homma (10) Patent No.: US 7,505,804 B2
(45) Date of Patent: Mar. 17, 2009

(54) ULTRA HIGH-SPEED MAGNETIC RESONANCE IMAGING DEVICE

(75) Inventor: Kazuhiro Homma, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 110 days.

(21) Appl. No.: 10/515,186

(22) PCT Filed: May 27, 2003

(86) PCT No.: PCT/JP03/06586

§ 371 (c)(1), (2), (4) Date: May 9, 2005

(87) PCT Pub. No.: WO03/101293

PCT Pub. Date: Dec. 11, 2003

(65) Prior Publication Data

US 2005/0203376 A1 Sep. 15, 2005

(30) Foreign Application Priority Data

May 31, 2002 (JP) ............................. 2002-159003

(51) Int. Cl.
*A61B 5/055* (2006.01)
(52) U.S. Cl. ..................... 600/410; 324/307; 324/309
(58) Field of Classification Search ................ 600/410, 600/413, 407, 409; 324/307, 311, 309; 128/653
See application file for complete search history.

(56) References Cited

U.S. PATENT DOCUMENTS 4,579,121 A * 4/1986 Macovski ................... 600/410
4,663,591 A * 5/1987 Pelc et al. ................... 324/309

(Continued)

FOREIGN PATENT DOCUMENTS

JP       04-246327       9/1992

(Continued)

OTHER PUBLICATIONS

Arie, Hiroaki et al. "A New Image Processing Method for 4-Dimensional MRI", The Japan Society of Mechanical Engineers, pp. 331-332, with English translation 2002.

*Primary Examiner*—Eric F Winakur
*Assistant Examiner*—Lawrence N Laryea
(74) *Attorney, Agent, or Firm*—Oblon, Spivak, McClelland, Maier & Neustadt, P.C.

(57) ABSTRACT

Ultrahigh speed magnetic resonance imaging equipment is capable of predicting temporal and spatial operation of an object to be imaged and significantly reducing the number of phase and frequency encodings, thereby significantly increasing the imaging speed. An object (4) to be imaged is placed in a static magnetic field (3) and a gradient magnetic field and a radiofrequency wave are applied to the object in an x, y and/or z direction in an orthogonal coordinates system. The equipment includes means for collecting only phase and frequency encodings optimized based on an estimate of motion of the object (4) to be imaged and means for complementing unacquired data. By increasing the imaging speed, as described above, the temporal resolution is improved and it is possible to display a two-dimensional cross section and three-dimensional internal structure of the object in motion as an image. As a result imaging is possible even when the object (4) to be imaged is temporally deformed or displaced.

4 Claims, 10 Drawing Sheets

U.S. PATENT DOCUMENTS

| | | | |
|---|---|---|---|
| 4,949,042 A * | 8/1990 | Kuhara et al. | 324/311 |
| 5,226,418 A * | 7/1993 | Bernstein et al. | 600/419 |
| 5,423,315 A * | 6/1995 | Margosian et al. | 600/410 |
| 5,657,757 A * | 8/1997 | Hurd et al. | 600/413 |
| 5,873,825 A * | 2/1999 | Mistretta et al. | 600/410 |
| 5,928,146 A * | 7/1999 | Itagaki et al. | 600/410 |
| 6,114,852 A * | 9/2000 | Zhou et al. | 324/306 |
| 6,411,089 B1 * | 6/2002 | Anand et al. | 324/309 |
| 6,560,353 B1 * | 5/2003 | Haacke et al. | 382/128 |
| 6,577,127 B2 * | 6/2003 | Harvey et al. | 324/307 |
| 6,647,134 B1 * | 11/2003 | McGee et al. | 382/128 |
| 6,748,098 B1 * | 6/2004 | Rosenfeld | 382/131 |
| 7,005,853 B2 * | 2/2006 | Tsao et al. | 324/309 |
| 2002/0002331 A1 * | 1/2002 | Cline et al. | 600/410 |
| 2002/0190714 A1 * | 12/2002 | Bernstein | 324/307 |
| 2003/0102864 A1 * | 6/2003 | Welch et al. | 324/307 |
| 2003/0135103 A1 * | 7/2003 | Mistretta | 600/410 |

FOREIGN PATENT DOCUMENTS

JP     2000-225103     8/2000

* cited by examiner

(a) a trajectory in k space (b) Method for applying inclined magnetic field (x, y direction)

Actually measured image

| | Actual image | Amplitude | Phase |
|---|---|---|---|
| $T_0$ |  |  |  |
| $T_1$ |  |  |  |

Complimented image

| | | | |
|---|---|---|---|
| $\dfrac{T_0+T_1}{2}$ |  |  |  |

FIG. 7

(a) Left direction displacement by 32 pixels (b) Right direction displacement by 32 pixels

ULTRA HIGH-SPEED MAGNETIC RESONANCE IMAGING DEVICE

TECHNICAL FIELD

This invention relates to ultrahigh speed magnetic resonance (MR) imaging equipment based on nuclear magnetic resonance (NMR).

BACKGROUND ART

The conventional nuclear magnetic resonance imaging (MRI) device is provided on the periphery of an object to be imaged with a magnet for generating a static magnetic field and a gradient magnetic field which is varying temporal and spatial magnetic field intensity (gradient coil), and is consequently enabled to form a spatially uniform magnetic field with the gradient coils. The magnetic resonance imaging is an operation of applying a radiofrequency (RF) wave to an object to be imaged for the purpose of magnetic resonance in a static magnetic field $B_0$ and consequently encoding and imaging the phase and the frequency of a spin in the magnetically resonating atomic nuclei. For the sake of reducing the spatial distribution of the density and the chemical structure of a resonant element, for example, to an image, an gradient magnetic field having spatially varying magnetic field intensities in the x, y and z directions is superposed. Meanwhile, the technique for heightening the speed (shortening the imaging time) results in curtailing the time for instrumentation. Various methods for high speed and ultrahigh speed imaging have been hitherto proposed and applied for patent. They include the gradient recalled echo (GRE) method, the fast field echo (FE) method, the echo planar imaging (EPI) method, the spiral fast imaging, spiral scan (SPI) method and the single-excitation spin echo (SE) method, for example.

The time required for imaging a two-dimensional image in the conventional technique is in the range of several seconds to some tens of seconds (GRE method), 0.1 to several seconds (EPI method and SPI method) and 0.02 to several seconds (single-excitation SE method) when the image consists of 128 by 128 pixels. When the three-dimensional image consists of 128 by 128 by 128 pixels these ranges are each increased to some tens to 100 times those mentioned above. This time requirement thus has posed a problem.

This invention has its principle based on nuclear magnetic resonance similarly to the conventional techniques and makes it possible to visualize the state (structure and function) in the two-dimensional and three-dimensional spatial distribution in an object to be imaged and the temporal change thereof. It is aimed at providing a device which, by predicting the temporal and spatial operation of an object to be imaged, thereby decreasing greatly the numbers of phase encodings and frequency encodings, is enabled to accomplish such a remarkable increase of speed as has never been attained by the conventional technique.

(1) Improvement of Temporal Resolution in Consequence of Increased Speed of Imaging The alleviation of a burden on an object to be imaged (the decrease of the time bound by imaging), and the exaltation of the temporal resolution in the imaging are attained in consequence of the increase of speed (the decrease of the imaging time). On the other hand, the increase of the number of dimension results in increasing the amount of information to be obtained.

(2) Imaging of Object in Motion (Reduction of Temporal Change to Image)

The internal changes of an object to be imaged (chemical changes and reactions and physical changes of flows and deformations), which are occurring in a brief duration of time as compared with the imaging time attained by the existing technique, are comprehended. The spatial changes of a spin originating in a magnetic resonance element existing within a two-dimensional plane (x, y) are acquired and displayed in a three-dimensional image (x, y, t), The spatial displacements of a spin originating in a magnetic resonance element existing within a three-dimensional structure (x, y, z) are collected and displayed in a four-dimensional image (x, y, z, t).

DISCLOSURE OF THE INVENTION

This invention provides ultrahigh speed magnetic resonance imaging equipment, comprising an imaging unit intended to place an object to be imaged in a static magnetic field and apply a temporally specific gradient magnetic field and a radiofrequency wave to the object in an x, y and/or z direction in an orthogonal coordinates system, and provided with means for collecting only phase encodings and frequency encodings optimized based on an estimate of motion of the object to be imaged and means for complementing unacquired data.

In the ultrahigh speed magnetic resonance imaging equipment of this invention, the motion of the object to be imaged is estimated under a specific restraining condition by analyzing a change in phase of a signal to be observed.

In the ultrahigh speed magnetic resonance imaging equipment of this invention, the unacquired date is extracted from a complete data obtained by executing all the phase encodings and frequency encodings and then complemented.

The ultrahigh speed magnetic resonance imaging equipment of this invention places an object to be imaged within a static magnetic field $B_0$ and applies temporally specific gradient magnetic field G (w, y, z) and radiofrequency wave to the object in the x direction, y direction or z direction in the orthogonal coordinates system. The reconstruction of a two-dimensional or three-dimensional image is attained not by executing all the phase encodings and frequency encodings but by applying only the phase encodings and frequency encodings optimized on the basis of the estimation of the operation of an object to be imaged. By decreasing the acquisition of data, it is made possible to increase the speed of imaging (ultrahigh speed imaging). Since the reconstruction of an image is derived from scanty data (incomplete data), it is executed after the unacquired data has been complemented by application of the various characteristic properties shown below.

(1) Utilization of the characteristic properties of Fourier transformation (2) Estimation (prediction) of motion (3) Complement of data (complementing uncollected data=unacquired data)

The characteristic properties mentioned above will be described sequentially below.

(1) Utilization of the characteristic properties of Fourier transformation:

The operation of the magnetic resonance imaging obtains spatial data by applying magnetic field gradients, thereby varying the phase for resonating a spin by the dephasing effect, and analyzing an observed signal (free induction decay (FID), echo, etc.) for frequency distribution by the use of Fourier transformation. When the Fourier transformation is used for the reconstruction of an image, the displacement of an object to be imaged (amount and direction of displacement) can be quantitatively attained in the form of a change in phase.

(2) Estimation (prediction) of motion:

On the basis of the principle of (1) mentioned above, when the shape of an object to be imaged is already known, by analyzing the change in phase of the observed signal, it is made possible to estimate the motion of the object under the following conditions (restraining conditions during the estimation of the motion).

(a) The object to be imaged should produce no change in shape (only spatial displacement) or the change in shape, if any, should allow quantitative regulation.

(b) The velocity and the acceleration during the displacement and the deformation should allow estimation.

(c) The displacement and the deformation should allow their stay in the imaging region.

(3) Complementing uncollected data:

With the object of decreasing the acquisition time, the present procedures resort to a decrease in the numbers of phase and frequency encodings. As a result, the incomplete data culminate into the reconfiguration of an image. The unacquired data constitute a component not contributing to the displacement and is complemented by extraction from all the data separately collected (complete data). The term "complete data" as used herein means the data to be acquired by executing all the phase and frequency encodings with respect to one and the same object to be imaged. They are obtained by the conventional magnetic resonance imaging technique.

This invention brings about the following effects.

(1) In the magnetic resonance imaging equipment, the imaging time T is proportional to the number of phase encodings PE and to the repetition time TR of the individual PE (T=PE×TR). Thus, by decreasing the number PE of phase encodings, it is made possible to decrease the imaging time. This invention, by decreasing the number PE of phase encodings, is enabled to curtail the imaging time and heighten the speed of imaging.

(2) By estimating the motion of an object to be imaged, it is made possible to complement the unacquired data and reconstruct a two-dimensional or three-dimensional image. Owing to the possession of the characteristic property of being capable of observing a signal at an ultrahigh speed, the temporal [t] change of a magnetic resonance element in an object to be imaged can be grasped. It is consequently made possible to effect two-dimensional display [x, t] (instrumentation and display) of one-dimensional spatial distribution [x], three-dimensional display [x, y, t] of two-dimensional spatial distribution [x, y], or four-dimensional display [x, y, z, t] of three-dimensional spatial distribution [x, y, z].

(3) By increasing the imaging speed, it is made possible to enhance the temporal resolution and cause the two-dimensional cross section of an object in motion or the internal construction of a three-dimensional cube to be displayed as an image. As a result, particularly even when an object to be imaged is temporally deformed or displaced, the imaging which is not easily attained by the conventional magnetic resonance imaging equipment can be realized by this invention. Thus, this imaging can be expected to be applicable to various fields.

BRIEF DESCRIPTION OF THE DRAWINGS

FIG. 7(a) depicting the case in which the data (object to be imaged) of 128 points existing in the center of an imaging region of 256 points is displaced by 32 pixels in the right direction and FIG. 7(b) depicting the changes in the real number part and the imaginary number part of the k space obtained by subjecting the 32 pixels involved in the displacement to the left direction each to one-dimension Fourier transformation.

BEST MODE FOR CARRYING OUT THE INVENTION

Now, this invention will be described in detail below with reference to the accompanying drawings.

Figure 1:
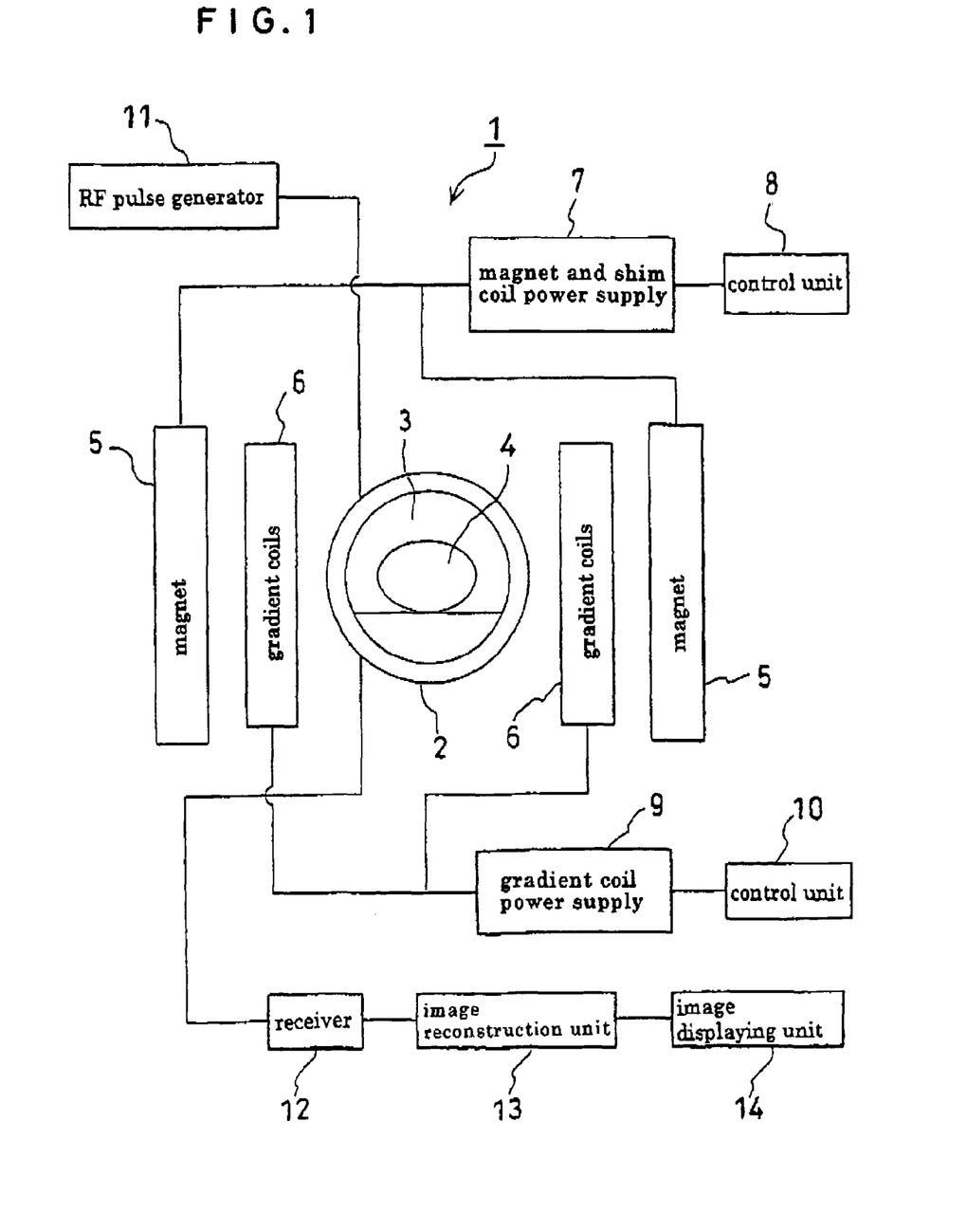
FIG. 1 is a schematic configuration diagram illustrating one example of the ultrahigh speed magnetic resonance imaging equipment contemplated by this invention.

FIG. 1 shows one example of the ultrahigh speed magnetic resonance imaging equipment for embodying this invention based on the principle of nuclear magnetic resonance. In FIG. 1, an MR imaging equipment 1 is furnished with an excitation and detection unit 2. The excitation and detection unit 2 demarcates a measuring region 3 and excites a substance 4 for measurement in the measuring region 3 as well. To the excitation and detection region 2, an RF pulse (excitation pulse) is supplied from an RF pulse generator 11. This RF pulse possesses a resonance frequency corresponding to the numerous points in the measuring region 3. On the outside of the excitation and detection unit 2, a magnet 5 for generating static magnetic field and gradient coils 6 for generating gradient magnetic field are laid out in a planar state.

Figure 2:
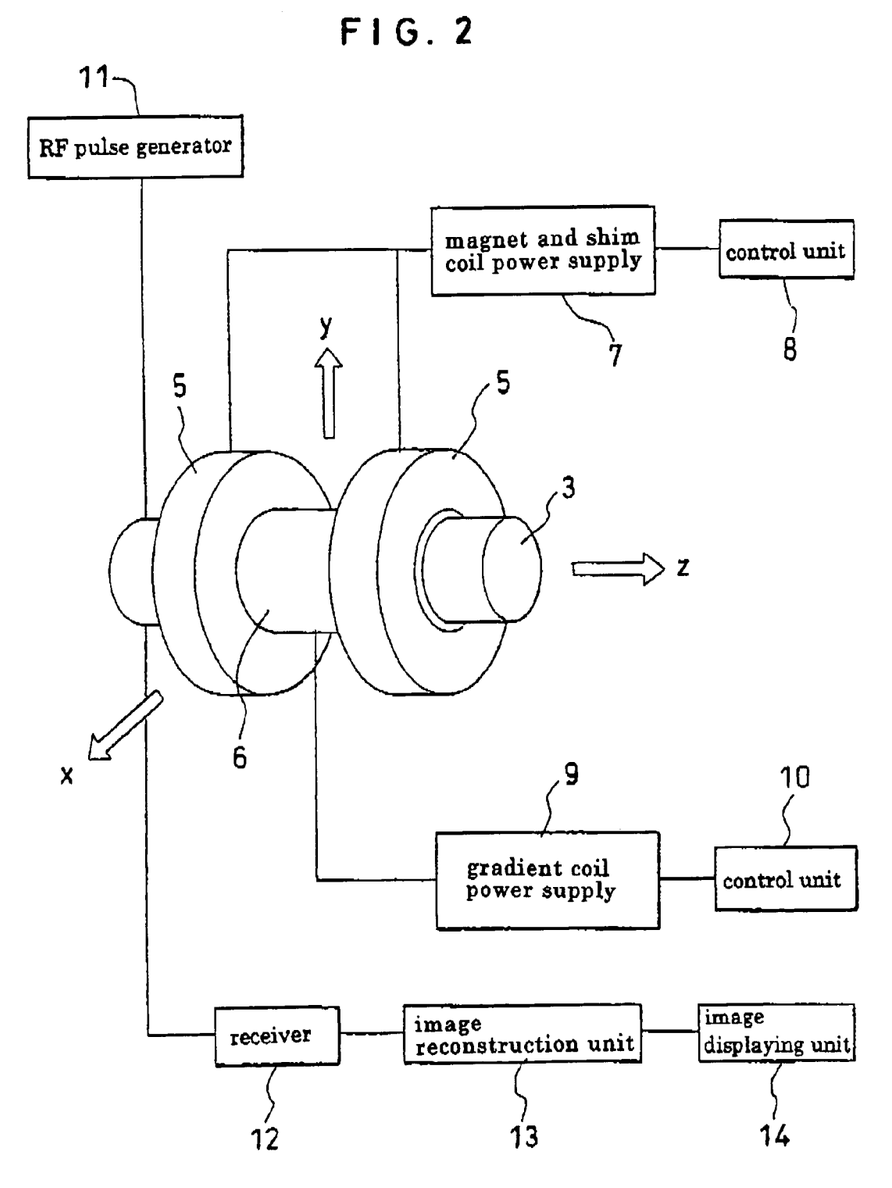
FIG. 2 is a schematic configuration diagram illustrating another example of the ultrahigh speed magnetic resonance imaging equipment contemplated by this invention.

The ultrahigh speed magnetic resonance imaging equipment shown in FIG. 2 represents an example which has a magnet 5 generating static magnetic field and gradient coils 6 generating gradient magnetic field in the magnet shown in FIG. 1. The magnet 5 is intended to generate a temporally and spatially specified magnetic field for an object to be imaged. It is preferred to form a static high magnetic field. A super-conducting magnet and a permanent magnet, for example, are available therefore. The static magnetic strength $B_0$ is in the range of 0.02 to 0.25 T (tesla=Wb/m$^2$) in the normal conduction magnet or in the range of 0.35 to 2.00 T in the superconducting magnet, for example. To the static magnetic field generating magnet 5, an electric current is supplied from a static magnetic field magnet and shim coil power source 7.

The gradient coil 6 is a coil intended to generate a gradient magnetic field for temporally and spatially (G(w, y, z, t)) varying the magnetic field strength in the measuring region 3. To this coil 6, an electric current is supplied from a gradient magnetic field generating coil power source 9. The strength of the gradient magnetic field is decided in conformity with the width of the spectrum of a signal obtained by resonance, the spatial resolution and the size of the imaging region.

The magnet 5 and the gradient coil 6 are respectively possessed of control units 8 and 10 which control the strengths of power source and magnetic field.

To have nuclear magnetic resonance, the equipment is provided with the RF pulse generator 11 which serves to apply in a pulsated form a radiofrequency wave having a frequency $\upsilon$i equivalent to die resonance frequency. In consequence of inducing the nuclear magnetic resonance, the excitation and detection unit 2 disposed in the periphery of an object to be imaged is observed to issue a signal (free induction decay signal or echo signal). This signal is acquired by a receiver 12. The signals which are subsequently observed are handled in accordance with the following method for temporal and spatial application of a gradient magnetic field so as to induce reconstruction of the spatial distribution and the temporal change of a magnetic resonance element in an imaging object as an image (two-dimensional [x, y] [x, y] or three-dimensional [x, y, z] image) by the use of a reconstruction unit 13. The reconstructed image inclusive of such chronological changes is displayed two-dimensionally [x, t], three-dimensionally [x, y, t] or four-dimensionally [x, y, z, t] by the image displaying unit 14.

Figure 3:
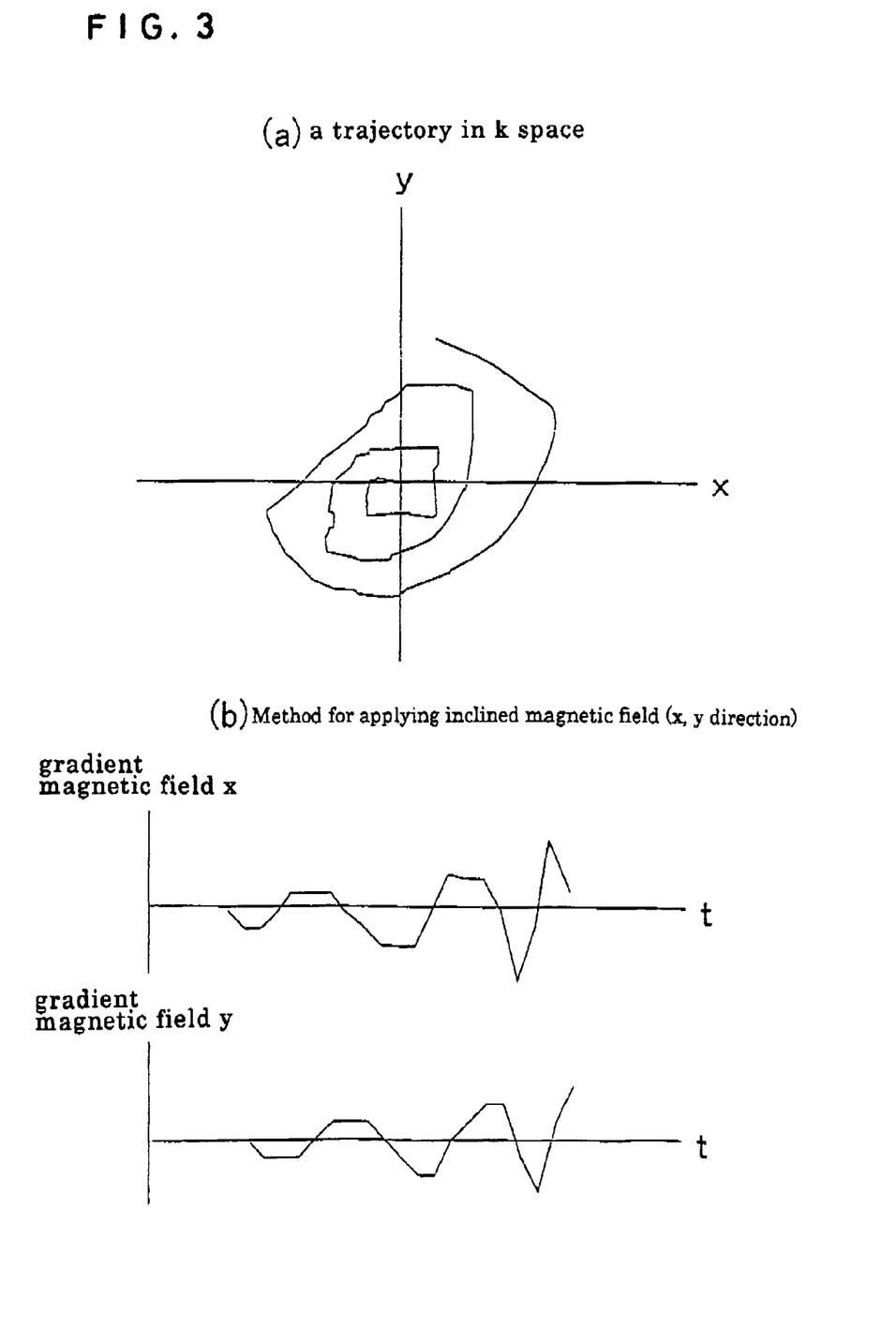
FIG. 3(a) is a diagram showing the optimum trajectory for performing the two-dimension [x, y] ultrahigh speed imaging of a motion of an object to be imaged
FIG. 3(b) is a diagram illustrating a method for applying a gradient magnetic field for the purpose of realizing the optimum trajectory of FIG. 3(a).

FIG. 3 illustrates a method for the applying the optimum gradient magnetic field for the sake of the two-dimensional [x, y] ultrahigh speed imaging. FIG. 3(*a*) shows the optimum trajectory during the data acquisition of the ultrahigh speed imaging of the motion of an object to be imaged and FIG. 3(*b*) shows the method for applying the optimum gradient magnetic field required for the imaging. The strength and the waveform of the trajectory and the corresponding gradient magnetic field to be applied are provided as optimized to suit the shape and the motion of an object to be imaged. The amounts of data (entropy) of the signals specified by the temporal and spatial distributions of the nuclear magnetic resonance elements an object to be imaged has are analyzed and optimized for the purpose of measuring the upper N (N=1, 2, 3, . . . ) according to the sequence in largeness of the amounts of data. FIG. 3 depicts the case of using the motion of five human fingers as an object to be imaged and assuming N to be 21 points. By applying gradient magnetic fields in such magnitudes as shown in FIG. 3(*b*) to the X and Y directions so as to describe a trajectory shown in FIG. 3(*a*), the signal components having large amounts of data distributed on the trajectory and derived from the signals distributed in the k space can be observed in time series.

Figure 4:
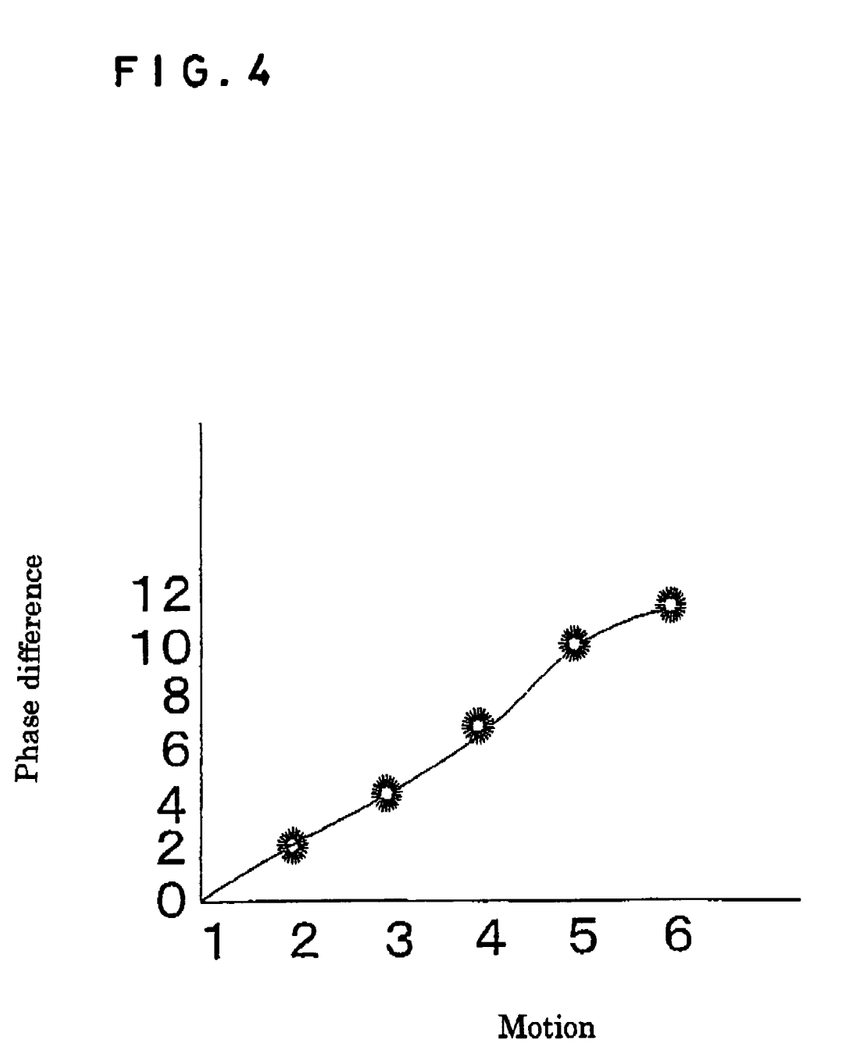
FIG. 4 is a diagram showing the change in phase of a signal obtained by actual measurement during the motion of an object to be imaged in the embodiment of this invention.

FIG. 4 shows the change in phase of the signals (m pieces; m=1, 2, . . . , 6) obtained by actually measuring the motion of an object to be imaged. The vertical axis is the scale of the difference in phase from the motion 1 of fingers.

When an object to be imaged produces a spatial displacement (motion), the phase of the signal observed in the k space is varied in accordance with the amount of displacement and the direction of displacement FIG. 4 shows the change in phase of an echo signal in the gripping motion of a human index finger.

From the changes in phase of the motions 1 to 6, the motion of an object to be imaged can be continuously estimated as a phase difference indicated with a solid line in FIG. 4. From the changes in phase of the signals obtained based on this estimate of motion, the positions of the signals to be observed in the k space, namely the trajectory in the k space (FIG. 3(*a*)) are obtained and the strengths of the gradient magnetic fields (FIG. 3(*b*)) to be applied during the course of imaging are decided based on the trajectory. The method for ultrahigh speed imaging proposed by this invention decreases the amount of data to be observed for the purpose of accomplishing an ultrahigh speed operation and reconstructs an image from the data. For this purpose, the motion is estimated by analyzing the changes in phase of the signals at the N points to be observed.

Figure 5:
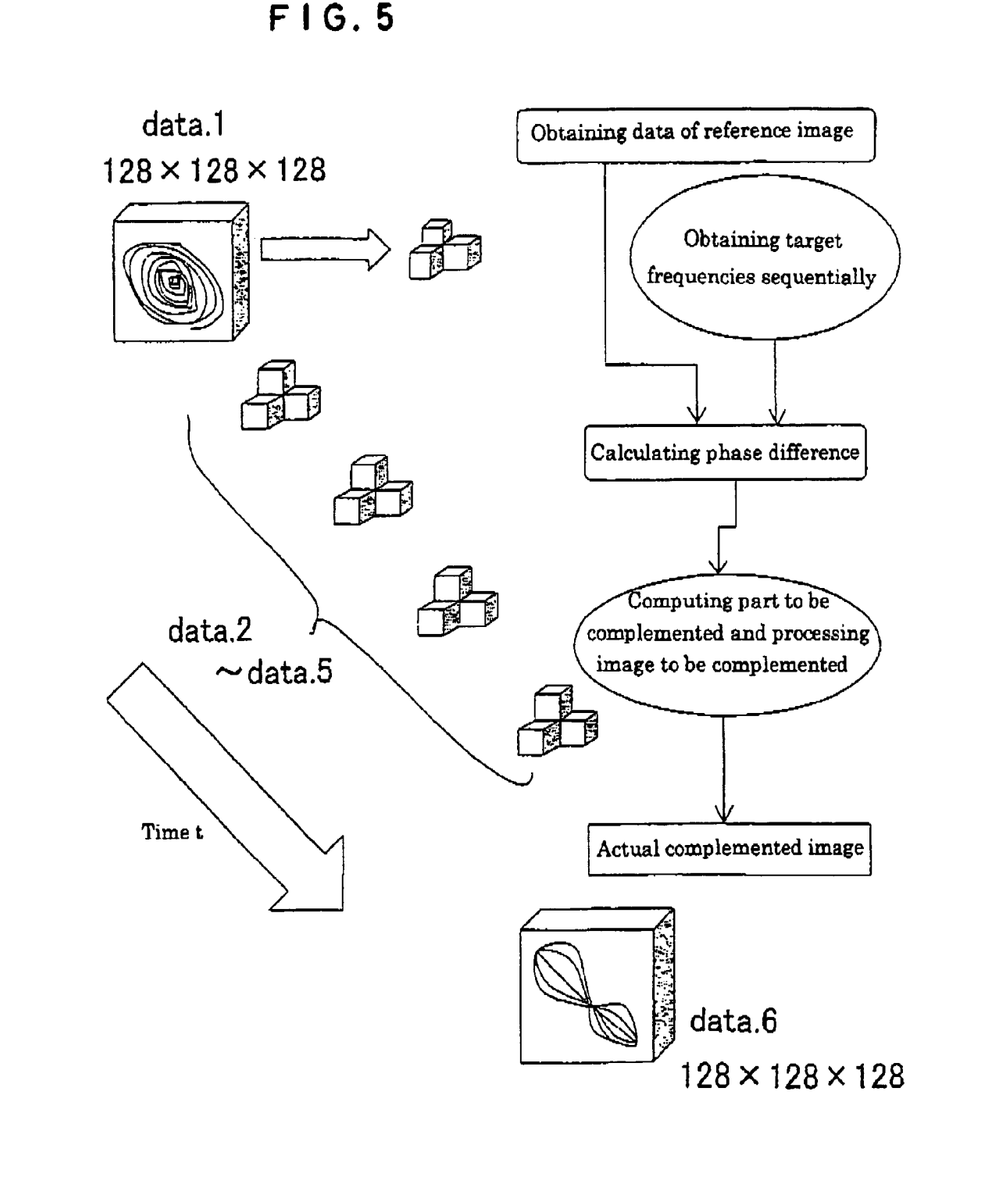
FIG. 5 is a diagram showing one example of the actual imaging procedure at an ultrahigh speed of m three-dimensional images formed of n by n by n pixels in one embodiment of this invention.

One example of the procedure for actually imaging at an ultrahigh speed m pieces of three-dimensional images having n by n by n pixels is shown in FIG. 5. While this case assumes m=6 and n=128, generally m represents an arbitrary integer and n represents a power of 2. At the time of effecting the operation of imaging, arbitrary three-dimensional images in motion on the k space (data 1 and data 6 in the illustrated case) are observed first. Then, only the optimum N point (refer to FIG. 3: N=3 is illustrated in FIG. 5) which is decided based on the estimate of a motion in the three-dimensional k space during the motion of an object to be imaged is observed.

The changes in phase of the data obtained in FIG. 5 (a total of six images in the illustrated example [two images each formed of 128 by 128 by 128 pixels and four data each formed of only three pixels]) are calculated based on FIG. 3. A three-dimensional image is reconstructed by estimating the motion of an object to be imaged from the results obtained above and complementing the part lacking in the four data (data 2, data 3, data 4 and data 5) by using the two three-dimensional data (data 1 and data 6). Since it is only the data of the point N that is collected in the four data (data 2, data 3, data 4 and data 5) in the present example, this example attains addition to the speed of imaging and realizes ultrahigh speed magnetic resonance imaging.

FIG. 6 through FIG. 9 show the procedures for imaging the grasping motion of five human fingers and the results of reconstruction of an image.

Figure 6:
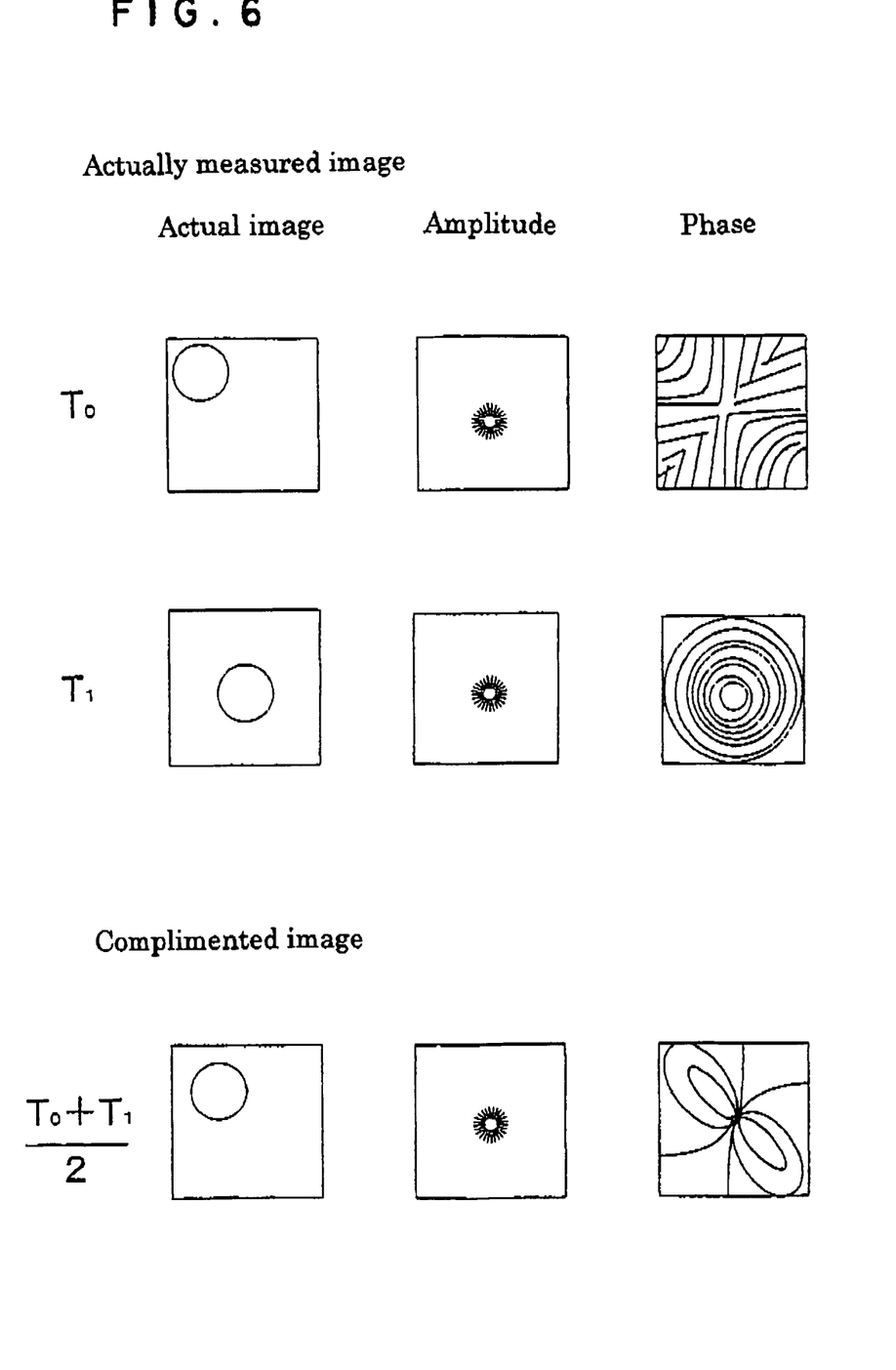
FIG. 6 illustrates the change in phase of a signal in a k space obtained in one example of this invention and visualized by a two-dimensional imaging computer simulation.

FIG. 6 illustrates changes in phase of a signal in the k space obtained by computer simulation of a two-dimensional imaging. The object used for the imaging is a circle which is freely moved within the measuring region.

When the imaging object present at the upper left portion of the measuring region at the time $T_0$ is displaced to the center of the measuring region by the time $T_1$, the distributions of amplitude and phase of the signals obtained by imaging the object at varying times are varied at these times as shown in FIG. 6. Since the imaging object has an unchanged size, the individual amplitudes are not varied. In contrast, the phases are varied in conformity with the positions of the imaging object as shown in FIG. 7.

The motion between the times $T_0$ and $T_1$ can be estimated from these changes in phase (differences in phase) as shown in FIG. 4. At the intermediate position between the times $T_0$ and $T_1$, for example, the imaging object is reconstructed as an image placed at the relevant intermediate position from the phase distribution of ½ of the phase difference and the amplitude. FIG. 6 depicts the results of the estimation of the imaging object at the varying intermediate positions (($T_0+T_1$)/2) actually based on $T_0$ and $T_1$.

Figure 7:
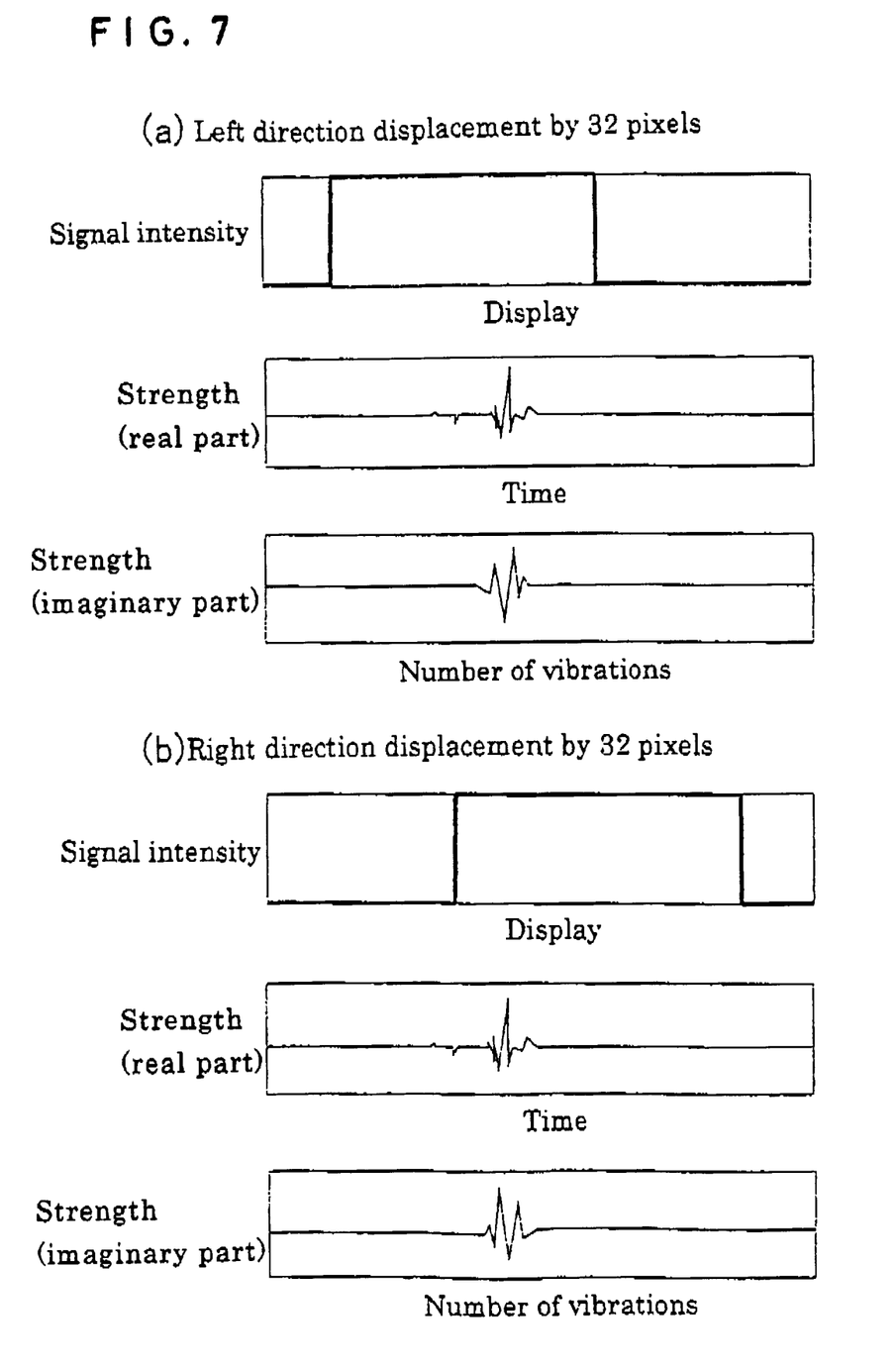
FIG. 7 is a diagram showing the results of a computer simulation (one-dimensional Fourier transformation) of the change in phase of a signal observed when an object to be imaged is moved into an imaging region in an example of the invention on the assumption of the change in phase in consequence of a displacement in one-dimensional direction.

FIG. 7 depicts the results of subjecting the changes in phase of the signals observed during the motion of the imaging object within the measuring region to computer simulation (one-dimensional Fourier transformation). FIG. 7 shows the changes of the real number part and the imaginary number part of the k space obtained by assuming the changes in phase produced in consequence of the displacement in the one-dimensional direction and subjecting these changes individually to one-dimensional Fourier transformation, FIG. 7(a) representing the case in which the data of 128 points (object to be imaged) existing at the center of the imaging region of 256 points is displaced by 32 pixels in the direction of right and FIG. 7(b) the case in which they are displaced by 32 pixels in the direction of left. Since the imaginary number part is varied depending on the direction of displacement of the imagining object the direction of displacement is known from the results of analyzing the changes in phase. In FIG. 7(a) and FIG. 7(b), for example, the changes occur in opposite directions.

Figure 8:
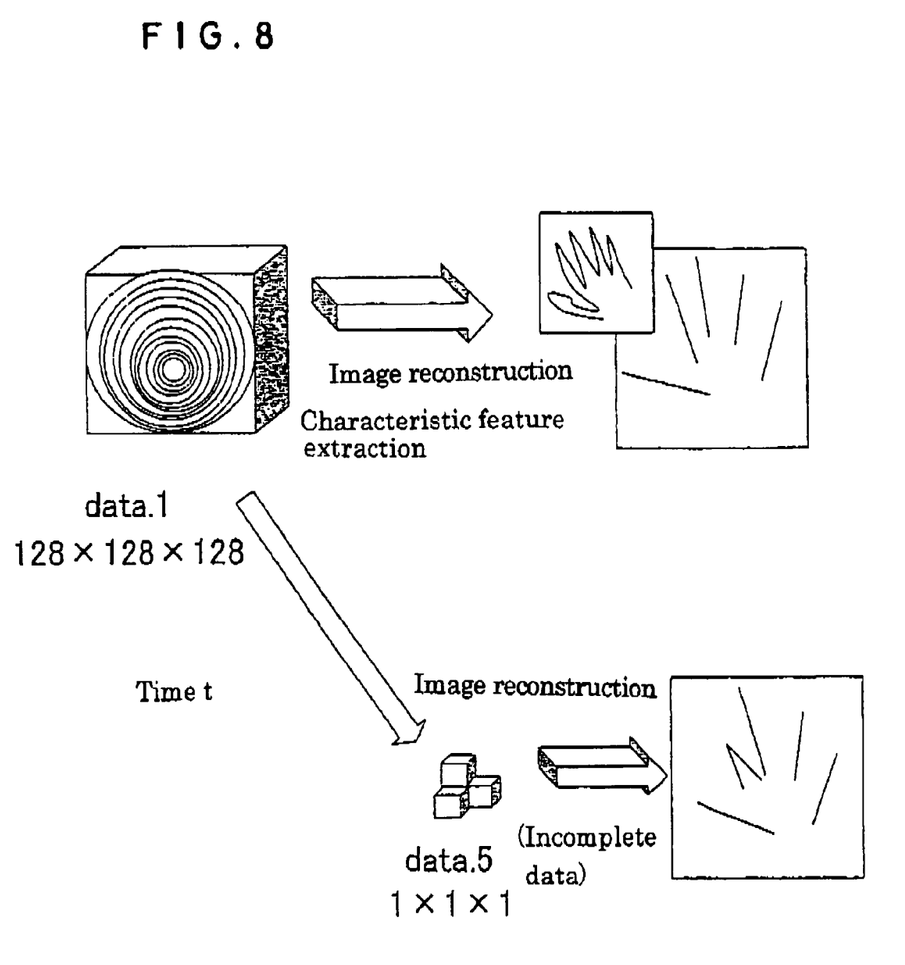
FIG. 8 is a three-dimensional image of five human fingers imaged and estimated on the basis of FIG. 5.

FIG. 8 is a three-dimensional image of five human fingers imaged and estimated on the basis of FIG. 5. It results from acquiring 128 by 128 by 128 pixels for data 1 and the data solely of the three points (1, 0, 0), (0, 1, 0) and (0, 0, 1) in the k space for the data 5, estimating and imaging the motions of data 1 and data 6, and acquiring reconfiguration.

Figure 9:
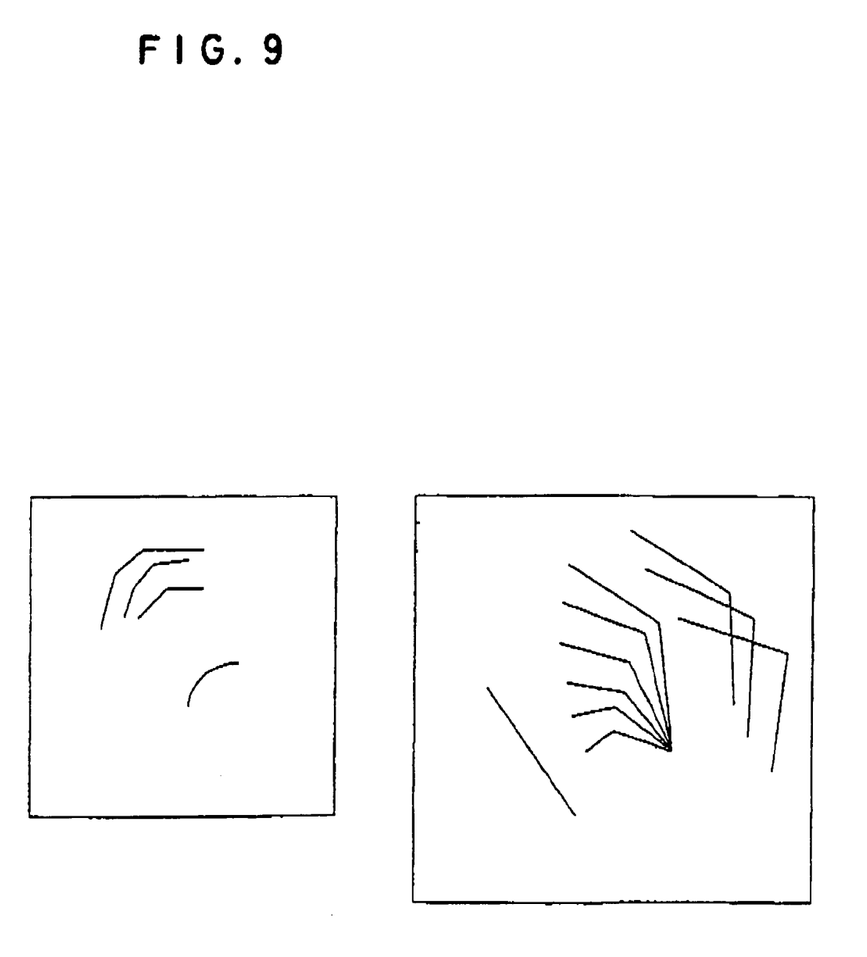
FIG. 9 is a diagram showing the results of the operation of four-dimensional magnetic resonance imaging for 11 reconstructed continuous images subsequent to compensating an actually imaged part by estimating the grasping motion of five human fingers.

FIG. 9 shows the results of estimating the gripping motion of five human fingers in data 1 to data 6, complementing the actually imaged part, and subsequently reconstructing 11 continuous images, thereby obtaining a four-dimensional magnetic resonance image [x, y, z, t].

Figure 10:
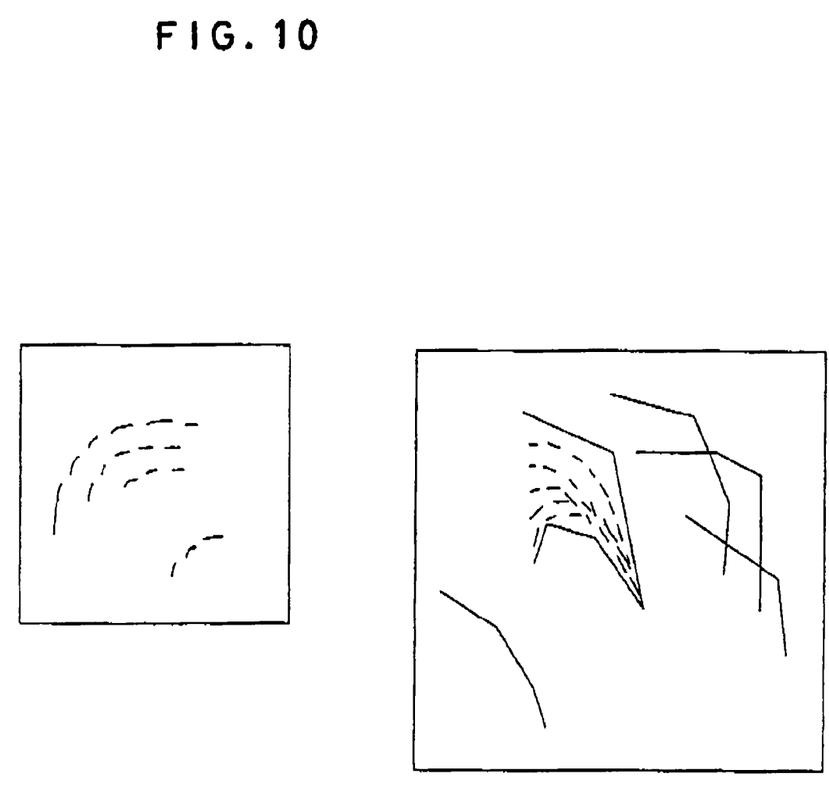
FIG. 10 shows an actually formed image with a "solid line" and an image obtained by estimating and compensating with a "broken line" in the image of FIG. 9.

In FIG. 10, the actually imaged part of the image of FIG. 9 is indicated with a "solid line" and the part thereof obtained complementing and estimating is indicated with a "broken line."

The present results are characterized by enabling ultrahigh speed imaging because a four-dimensional image is reconstructed only by collecting 128 by 128 by 128 pixels for the data 1 and the data 6 and three pixels of data 5 from the data 2. When the operation of ultrahigh speed imaging is carried out in accordance with the present invention, a restraining condition is required to be introduced in estimating a motion of the imaging object. In the case of the present example (gripping motion of five fingers), the conditions that (1) the joints of the five fingers should be only bent and that (2) the individual finger joints should be moved with a constant speed.

INDUSTRIAL APPLICABILITY

The ultrahigh speed magnetic resonance imaging equipment contemplated by this invention can be utilized for analyzing various materials, excluding metals and magnetic material, for internal structures and solid state properties (non-destructive examination); visualization of fluids; chemical structure and pharmacologic effect in pharmacy and chemistry; structural and functional analysis of living tissues in biology, medical diagnosis and physiology; and instrumentations of biological reactions and inspection and non-invasive diagnosis of diseases, for example.

The invention claimed is:

1. Ultrahigh speed magnetic resonance imaging equipment, comprising:
    an excitation and detection unit configured to expose a spatially displacing object to be imaged to a static magnetic field, to apply a radiofrequency wave and a gradient magnetic field temporally constant in an x direction, y direction or z direction in an orthogonal coordinates system, and to observe signals specified by temporal and spatial distributions of nuclear magnetic resonance elements induced in the object within k-space,
    receiver means for collecting the signals distributed in the k-space and observing upper N points (N is an integer; N=1, 2, 3, . . . ) from the signals according to a sequence in largeness of amounts of data, and
    image display means for reconstructing the signals as images,
    said excitation and detection unit having a function to observe signals only at the upper N points in time series as data of a reference image,
    said receiver means having a function to calculate changes in phase of the signals at the upper N points based on the data of the reference image to obtain calculation results and continuously estimate a motion of the object to be imaged between measurement times based on the calculation results and phase distributions and amplitudes of the signals at the upper N points, and
    said image display means having a function to complement unacquired data based on the estimated motion and to reconstruct a three-dimensional image.

2. Ultrahigh speed magnetic resonance imaging equipment according to claim 1, wherein motion of the object to be imaged is estimated under a specific restraining condition by analyzing a change in phase of a signal to be observed.

3. Ultrahigh speed magnetic resonance imaging equipment according to claim 1, the image display means complements the unacquired data through extraction thereof from a complete data obtained by executing phase encodings and frequency encodings of all of said data.

4. Ultrahigh speed magnetic resonance imaging equipment according to claim 1, wherein the changes in the phase of the object to be imaged are obtained by performing a frequency analysis on the measured signals using Fourier transformation.

* * * * *